United States Patent [19]
Wandke et al.

[11] Patent Number: 5,657,924
[45] Date of Patent: Aug. 19, 1997

[54] METHOD FOR WAVE SOLDERING WITH LEAD-FREE SOLDER MATERIALS

[75] Inventors: Ernst Wandke, Wolfratshausen, Germany; Hans Isler, Widen, Switzerland

[73] Assignees: Linde Aktiengesellschaft, Wiesbaden, Germany; EPM Handels AG, Zuerich, Switzerland

[21] Appl. No.: 438,555

[22] Filed: May 10, 1995

[51] Int. Cl.$^6$ ............................ H05K 3/34; B23K 35/38
[52] U.S. Cl. .................... 228/219; 228/206; 228/260
[58] Field of Search .................... 228/218, 219, 228/260, 42, 207, 206

[56] References Cited

U.S. PATENT DOCUMENTS

| | | | |
|---|---|---|---|
| 5,192,582 | 3/1993 | Liedke et al. | 228/206 |
| 5,259,546 | 11/1993 | Volk | 228/102 |

FOREIGN PATENT DOCUMENTS

| | | | |
|---|---|---|---|
| 557756A1 | 9/1993 | European Pat. Off. | 228/206 |

OTHER PUBLICATIONS

Abstract of Published German Patent Application No. DE 4,225,378 (Sep. 1993).
Peter Fodor, *Benefits of Gas Cover Soldering*, OCS–SMT Automation, Inc., Montreal, Canada, Nov. 30, 1989.

*Primary Examiner*—P. Austin Bradley
*Assistant Examiner*—Jeffrey T. Knapp
*Attorney, Agent, or Firm*—Evenson, McKeown, Edwards & Lenahan

[57] ABSTRACT

A method is available for wave-soldering component groups, especially printed circuit boards with shielding from the environment, in which lead-free or at least low-lead solders, especially tin solders, with a melting point of more than 210° C., are used. Since in wave soldering the solder bath temperature must usually be set considerably higher than the melting point of the solder, problems with overheating the components are encountered with higher-melting lead-free or low-lead solders. This problem is solved in accordance with the invention by setting a solder bath temperature which is only a few degrees Celsius above the melting point of the solder material, and performing the wave-soldering by the action of a plasma of a process gas atmosphere at low pressure.

8 Claims, No Drawings

METHOD FOR WAVE SOLDERING WITH LEAD-FREE SOLDER MATERIALS

BACKGROUND OF THE INVENTION

The invention relates to a method for wave-soldering component groups, especially printed circuit boards, with shielding from the environment, in which lead-free or at least low-lead solders, especially tin solders, with a melting point of more than 210° C. are used. As used herein, the term "low-lead solder" refers to a solder containing a maximum of 10 wt-% lead.

Lead-rich tin/lead solders with a melting point of about 185° C. are widely used today for soft-soldering electronic components. Especially in the case of wave-soldering processes, i.e., an operating principle in which the solder is transferred by a wave of molten solder onto the workpiece, the solder bath from which the wave is formed is set at a temperature that is 50° to 60° C. above the melting point of the solder. This temperature setting serves largely for the purpose of obtaining a solder of good viscosity which thereafter will form flawless and high-quality soldered junctions.

If in this process low-lead or lead-free solders of higher melting points are to be used—which is increasingly desirable today for environmental reasons—it will be necessary to establish higher solder bath temperatures. The lead-free or low-lead solders generally have a melting point that is at least about 30° C. higher than the commonly used eutectic tin/lead solders which melt at about 183° C. and are employed at a solder bath temperature of about 240° C. (see, for example, the article, "Weichlöten unter aktiviertem Schutzgas . . . " [soft soldering under activated protective gas . . . " ] in ELEKTRONIK PRODUKTION & PR ÜFTECHNIK—Apr. 1989, pp. 37–39, particularly p. 37, middle column). In contrast, the solders here addressed operate at solder bath temperatures of at least approximately 250° C.

When solder bath temperatures are above 250° C., however, there is a decidedly greater danger that electronic components might be heat-damaged. Consequently, there are components that cannot be soldered with lead-free or low-lead solders of high melting points, or that can be soldered only with a greater number of rejections for defects. For a discussion of temperature considerations in soldering see, for example, Volk, U.S. Pat. No. 5,259,546 (=DE 4,016,366) the disclosure of which is incorporated herein by reference.

SUMMARY OF THE INVENTION

It is therefore the object of the present invention to provide a wave soldering process for lead-free or low-lead solders of high melting temperatures above 210° C., which can be performed with less thermal stress on the components being soldered than can be achieved with the known wave-soldering methods.

This and other objects are achieved in the present invention by setting the solder bath temperature at only a few degrees Celsius, e.g. from 3° to 20° C., above the melting point of the solder, and by performing the soldering under the influence of a plasma of a suitable process gas atmosphere at a low pressure.

DETAILED DESCRIPTION OF PREFERRED EMBODIMENTS

By soldering under a plasma action, as disclosed in Published German Patent Application No. DE 4,225,378, it is surprisingly possible to set the soldering bath temperature considerably closer to the melting point of the solder, and nevertheless to obtain high-quality soldering results. As has already been stated, setting the temperature of the soldering bath considerably above the melting point temperature in conventional processes enables one to obtain a desirable liquid solder which has a good wetting action and gap filling quality and thus leads to good soldering results. As the applicant has now found, solder which is employed under the action of a plasma at appropriate low-pressure conditions also has precisely these qualities to a sufficient extent at temperatures only slightly above the melting point, and therefore also produces high-quality soldered junctions. Thus, it is possible according to the invention to operate with lowered solder bath temperatures, which substantially improves and makes more generally useful especially the use of lead-free, higher-melting solders composed primarily of tin or zinc, for example tin-silver solders. Suitable solders are known in the art, for example see DVS Fachbuchreihe Schweißtechnik, vol. 108, 1990, "Metallische Lotwerkstoffe" [metallic soldering materials] or Taschenbuch "H ütte", 22nd edition, 1915, especially page 681).

Basically, as shown hereinafter by the illustrative example of a preferred embodiment, the process is to be configured as regards the low-pressure conditions and the creation of the plasma as disclosed in co-pending U.S. patent application No. 08/307,633 (=DE 4,225,378), now allowed, the disclosure of which is incorporated herein by reference, except that the standard conditions as regards the solder bath temperature are not maintained. With a decided advantage, a solder bath temperature is established in accordance with the invention which is only 3° to 20° C., preferably 5° to 15° C., above the melting point of whatever solder is used.

In one simple, very functional variant of the invention, air is used as the process gas, optionally with admixtures of, for example, hydrogen and/or nitrogen. But better results are obtained when the process gas is selected from the group $N_2$, Ar, $O_2$, $H_2$, $SF_8$, FHC (=fluorinated hydrocarbons), FCHC (=fluorochloro hydrocarbons), and mixtures thereof. An especially effective embodiment of the invention is achieved when a process gas is used which simultaneously has both a reducing and an oxidizing action. Such a gas may consist essentially of:

0.5 to 10 vol.-% $O_2$,
80 to 20 vol.-% $H_2$ and
20 to 80 vol.-% $CF_4$ or $SF_6$, and optionally
up to 50 vol.-% Ar or $N_2$.

The invention will be described in further detail hereinafter with reference to an illustrative preferred embodiment.

EXAMPLE

A tin solder containing 3% silver is used for the wave soldering of assembled printed circuit boards. This SnAg 3 solder has a melting temperature of 220° C. and is used in the solder bath of a soldering apparatus like the one disclosed in the aforementioned Published German Patent Application No. DE 4,225,378. Soldering apparatus suitable for use in the present invention comprises a gas-tight apparatus chamber containing at least the soldering station; means for producing a low pressure in this chamber; and means for forming a low-pressure atmosphere in the plasma state (for example a high-frequency wave or microwave generator).

In an apparatus of this kind, a solder bath temperature of only 225° to 230° C. is established, and a plasma is produced, i.e., a gas containing ionized atoms and/or molecules and free electrons is formed, from a process gas that is under a pressure of less than 100 mbar, preferably in the range from about 0.1 to about 10 mbar. One gas that is especially suitable for use in the present invention contains 2 to 8 vol.-% of $O_2$, 40 to 60% $H_2$ and 30 to 55% tetrafluoromethane ($CF_4$). If printed circuit boards are guided through this, generally tunnel-like wave soldering apparatus, which also must be equipped with entry and exit locks, while the described temperature conditions are maintained and the plasma is sustained, then even with the above-described, unusually low solder bath temperature, a high-quality soldering of the connections—as a rule those between the pins of the components and the sockets in the circuit board—is obtained.

Thus, a wave soldering is accomplished with solder bath temperatures definitely lower than is usually the case, and lower than was at all possible by using conventional soldering apparatus operating at standard pressure and without the formation of a plasma, for example, in soldering apparatus, such as those disclosed in the technical article, "Weichlöten unter aktiviertem Schutzgas . . ." referred to in the introduction, in which the tin-silver solder bath temperatures of at least 270° C. are to be established, thereby substantially increasing the probability of heat damage to the electronic components. In addition to energy savings and high-quality soldering, the soldering process of the invention achieves the significant advantage that the components are exposed to significantly less thermal stress and thus are much less likely to suffer thermal damage.

The foregoing description and examples have been set forth merely to illustrate the invention and are not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A method for wave-soldering components to assembled printed circuit boards, with shielding from the environment, in which lead-free or low-lead solder having a melting point of more than 210° C. is employed, said method comprising:

establishing a solder bath temperature in the range from 3° to 20° C. above the melting point of the solder; and wave soldering the components to the board under a process gas plasma atmosphere at a pressure of less than 100 mbar.

2. A method according to claim 1, wherein the pressure of the process gas plasma atmosphere is in the range from about 0.1 to about 10 mbar.

3. A method according to claim 1, wherein the solder is a tin solder.

4. A method according to claim 1, wherein the solder bath temperature is in the range from 5° to 15° C. above the melting point of the solder.

5. A method according to claim 1, wherein the process gas comprises air.

6. A method according to claim 5, wherein said process gas comprises air admixed with at least one gas selected from the group consisting of nitrogen and hydrogen.

7. A method according to claim 1, wherein said process gas consists essentially of at least one gas selected from the group consisting of $N_2$, Ar, $O_2$, $H_2$, $SF_6$, fluorinated hydrocarbons, and fluorochloro hydrocarbons.

8. A method according to claim 7, wherein said process gas consists essentially of a mixture of:

0.5 to 10 vol.-% of $O_2$, 80 to 20 vol.-% of $H_2$ and 20 to 80 vol.-% of $CF_4$ or $SF_6$, and 0 to 50 vol.-% of Ar or $N_2$.

* * * * *